US010592065B2

(12) United States Patent
Chen

(10) Patent No.: US 10,592,065 B2
(45) Date of Patent: Mar. 17, 2020

(54) NAVIGATION THROUGH THE HIERARCHICAL STRUCTURE OF A THREE-DIMENSIONAL MODELED ASSEMBLY OF PARTS

(71) Applicant: DASSAULT SYSTEMES, Velizy Villacoublay (FR)

(72) Inventor: Pinghan Chen, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 143 days.

(21) Appl. No.: 14/827,034

(22) Filed: Aug. 14, 2015

(65) Prior Publication Data
US 2016/0048293 A1 Feb. 18, 2016

(30) Foreign Application Priority Data

Aug. 15, 2014 (EP) .................................... 14306280

(51) Int. Cl.
| | | |
|---|---|---|
| G06F 3/048 | (2013.01) | |
| G06F 3/0481 | (2013.01) | |
| G06F 3/0484 | (2013.01) | |
| G06F 3/0482 | (2013.01) | |
| G06F 17/50 | (2006.01) | |

(52) U.S. Cl.
CPC ........ G06F 3/04815 (2013.01); G06F 3/0482 (2013.01); G06F 3/04817 (2013.01); G06F 3/04842 (2013.01); G06F 17/5086 (2013.01); G06F 2203/04806 (2013.01)

(58) Field of Classification Search
CPC .... G06F 17/50; G06F 19/321; G06F 19/3437; G06F 9/4881; G06F 2209/483; G06F 2209/5013; G06F 2209/5015; G06F 2209/5017; G06F 8/451; G06F 8/452
USPC .................................................. 715/850, 852
See application file for complete search history.

(56) References Cited

U.S. PATENT DOCUMENTS

| | | | | |
|---|---|---|---|---|
| 7,002,581 | B2 * | 2/2006 | Shimamura ........... | G06F 17/214 345/467 |
| 7,526,316 | B2 * | 4/2009 | Shimizu .............. | G06F 3/04892 345/156 |
| 8,452,435 | B1 * | 5/2013 | Vieilly .................... | G06T 19/20 345/418 |
| 8,887,101 | B2 * | 11/2014 | Huang .................. | G06F 3/0481 715/803 |

(Continued)

FOREIGN PATENT DOCUMENTS

EP    1 612 698 A1    1/2006

OTHER PUBLICATIONS

European Search Report dated Feb. 9, 2015, in European Application No. 14306280.0-1954.

*Primary Examiner* — Di Xiao
(74) *Attorney, Agent, or Firm* — Oblon, McClelland, Maier & Neustadt, L.L.P.

(57) ABSTRACT

The invention notably relates to a computer-implemented method for navigating through the hierarchical structure of a three-dimensional modeled assembly of parts. The method comprises the steps of displaying a three-dimensional modeled assembly of parts, exploding, upon user interaction, the three-dimensional modeled assembly into parts, each part of the assembly corresponding to a first hierarchical level, and displaying each part in one cell of a first two-dimensional table.

16 Claims, 8 Drawing Sheets

(56) References Cited

U.S. PATENT DOCUMENTS

| | | | |
|---|---|---|---|
| 9,053,235 B1* | 6/2015 | Bienkowski | G06F 11/3604 |
| 9,141,746 B1* | 9/2015 | Ginetti | G06F 17/5068 |
| 2014/0245232 A1* | 8/2014 | Bailiang | G06F 3/04815 |
| | | | 715/850 |

* cited by examiner

NAVIGATION THROUGH THE HIERARCHICAL STRUCTURE OF A THREE-DIMENSIONAL MODELED ASSEMBLY OF PARTS

FIELD OF THE INVENTION

The invention relates to the field of computer programs and systems, and more specifically to a method, system and program for navigating through the hierarchical structure of a three-dimensional modeled assembly of three-dimensional parts.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Solutions have been developed for navigating through 3D assemblies of parts. For instance, specification tree is a two-dimensional (2D) graphical widget to show hierarchy relation between assembled 3D parts. It is loosely coupled with the 3D representation by means of "cross highlight": the selection of a node in the specification tree triggers a highlight of the corresponding 3D representation of the part displayed, and the selection of a 3D representation of a displayed part triggers the highlight of the corresponding node in the specification tree. However, this solution is not efficient because the "cross highlight" can highlight just one 2D node/3D part pair at a time, to understand a large assembly, the user needs to go back and forth many times between 2D specification tree and 3D representation. In addition, it does not scale well on large assemblies because the maximum number of elements can be shown on one screen is limited and depends on the size and/or definition of the screen on which the specification tree is displayed; consequently, the user needs to scroll up and down to navigate on a large assembly of parts.

Further solutions have been developed wherein the hierarchy information is directly embedded into a three-dimensional structure that is displayed to the user. The drawback of this kind of solution is that the 3D structure does not allow efficiently exploiting the screen space, thus making it as a bad solution on large assemblies.

Within this context, there is still a need for an improved navigation through the hierarchical structure of a 3D modeled assembly of parts.

SUMMARY OF THE INVENTION

It is therefore provided a computer-implemented method for navigating through the hierarchical structure of a three-dimensional modeled assembly of parts. The method comprises the steps of:

displaying a three-dimensional modeled assembly of parts;

exploding, upon user interaction, the three-dimensional modeled assembly into parts, each part of the assembly corresponding to a first hierarchical level; and displaying each part in one cell of a first two-dimensional table.

The method may comprise one or more of the following:

exploding, upon user interaction, a part corresponding to the first hierarchical level into parts corresponding to a second hierarchical level, and displaying each part corresponding to the second hierarchical level in one cell of a second two-dimensional table located in the cell wherein the exploded part was displayed;

each part is scaled to fit its cell;

each part displayed in one cell is freely rotable in its cell;

triggering, upon user action, a zoom in or a zoom out of one of the cells;

each part is displayed within a bounding frame enclosed in the cell;

each part is displayed with a same orientation as the one before the exploding step;

after the step of displaying, a step of undoing the step of exploding, displaying a reassembly of the formerly exploded three-dimensional modeled assembly;

selecting one of the displayed parts, displaying the selected part in a ghost shading;

the two dimensional table is a two dimensional square table.

It is further provided a computer program comprising instructions for performing the above method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
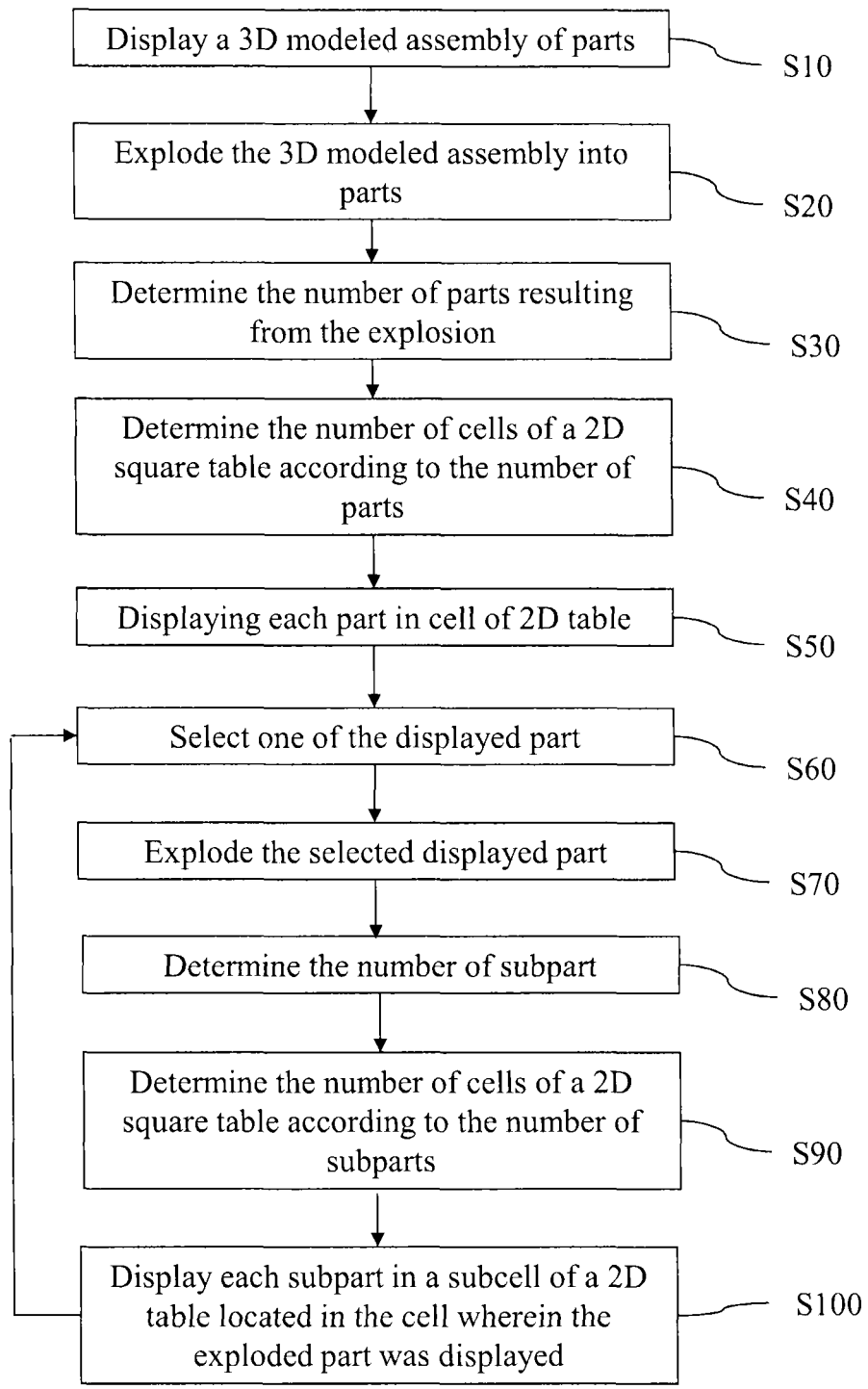
FIG. 1 shows a flowchart of an example of the method.

With reference to the flowchart of FIG. 1, it is proposed a computer-implemented method for navigating through the hierarchical structure of a three-dimensional (3D) modeled assembly of parts, e.g. 3D parts. The method comprises displaying a 3D modeled assembly of parts. The method further comprises exploding, upon user interaction, the 3D modeled assembly into parts. Each part of the exploded assembly corresponds to a first hierarchical level. The method also comprises displaying each part in one cell of a first 2D table. Such a method improves the navigation through the hierarchical structure of a 3D modeled assembly of parts.

Notably, the method provides a more efficient screen space use as usable screen area is totally occupied by 3D graphical representations of the assembly. There is no space waste of screen space because each part obtained as a result of the explosion of the assembly is placed in a cell of a 2D table that divides the available space on the screen into areas (the cells) wherein the part is represented. Hence, at the same time, each part is evenly positioned on a cell of the 2D table that provides virtual plan. This advantageously allows to represent more parts in limited screen area. Limited screen area is an increasing critical constraint posed by immerging of mobile devices like smartphones, tablets. In addition, there is no overlapping between parts: the view clarity is therefore improved for the user. Another advantage is that user interactions during structure navigation are made simpler. The user does not need to control the camera in order to see a part as all the parts are visible. Furthermore, navigation complexity in decreased as the cells of the table only changes the layout of assemblies; user continues to navigate in the scene using his camera. In addition, table style layout can also improve 3D rendering efficiency in three ways: firstly, table layout can enormously simplify the hidden surface determination process, i.e. cells that fall outside of screen can be simply ignored from display process. Secondly, by avoiding 3D parts overlapping, the number of visible objects is also decreased on the screen, thus improving rendering speed. Thirdly, when the user inspects a 3D part inside a particular cell by rotating the 3D representation, only the rotated part needs to be rendered. This leads to less CPU cycle usage (thus less electric power consumption) compares to full scene update in other navigation mode.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of exploding (S20, S70) is triggered upon user action. Said otherwise, the 3D assembly is exploded as a result of a user action.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method generally manipulates modeled objects, e.g. representing a product such as a part or an assembly of parts, or possibly an assembly of products. A modeled object is any object defined by data stored in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a 3D part or an assembly of 3D parts, or possibly an assembly of products. By "3D modeled object", it is meant any object which is modeled by data allowing its 3D representation. A 3D representation allows the viewing of the part from all angles. For example, a 3D modeled object, when 3D represented, may be freely rotated. The represented 3D modeled object may be handled and turned around an axis of rotation. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

CAE stands for Computer-Aided Engineering. By CAE solution, it is meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systemes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

Figure 2:
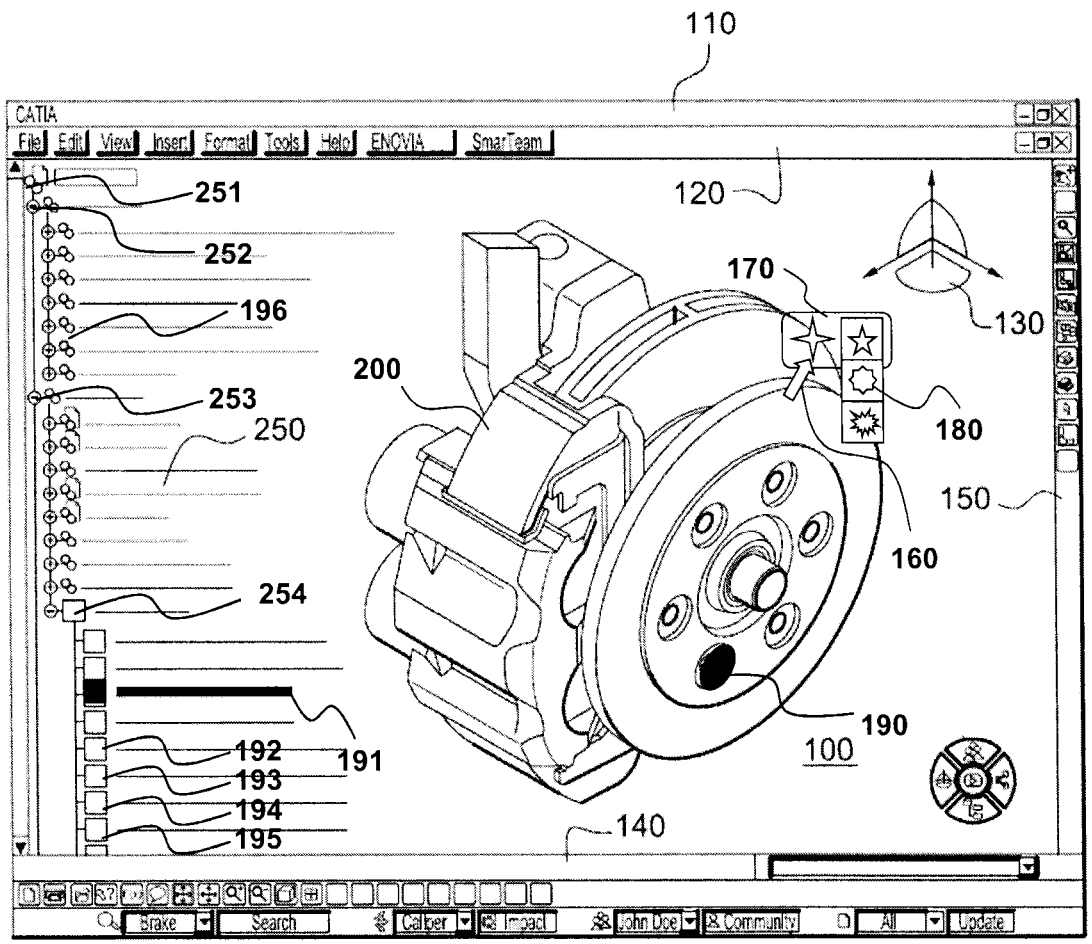
FIG. 2 shows an example of a graphical user interface of the system.

FIG. 2 shows an example of the GUI of the system, wherein the system is a CAD system.

The GUI 100 may be a typical CAD-like interface, having standard menu bars 110, 120, as well as bottom and side toolbars 140, 150. Such menu- and toolbars contain a set of user-selectable icons, each icon being associated with one or more operations or functions, as known in the art. Some of these icons are associated with software tools, adapted for editing and/or working on the 3D modeled object 200 displayed in the GUI 100. It is to be understood that the 3D modeled object 200 is a 3D modeled assembly of 3D parts. The software tools may be grouped into workbenches. Each workbench comprises a subset of software tools. In particular, one of the workbenches is an edition workbench, suitable for editing geometrical features of the modeled product 200. In operation, a designer may for example pre-select a part of the object 200 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 250 related to the displayed assembly 200. In the example of FIG. 2, the data 250 are displayed as a "product structure tree" that can also be referred to as "assembly structure tree", and their 3D representations 200 pertain to a brake assembly including brake caliper and disc. The "product structure tree" of an assembly of parts is a hierarchical decomposition of the assembly wherein relationships of the parts forming the assembly are arbitrarily settled by the user. The hierarchical structure of the assembly is thus represented as tree and forms a so called hierarchical structure of the assembly of parts. The product structure tree 250 comprises leaves 191-195 which identify and represent the different 3D parts forming the product 200. For instance, the selection of the leaf 191 triggers the selection of the 3D representation 190 of the 3D part of the displayed assembly 200; in this example, both the leaf and the 3D representation are highlighted. The product structure tree further comprises nodes 251-254 which identify sub-assemblies of parts and express hierarchical relationships which are arbitrarily settled by the user. Leaves 191-195 of the product structure tree 250 are particular nodes: a leaf is a hard link to a parts (a modeled object), while a node is symbolic (or virtual) link to a modeled object. The data structure of the assembly is hierarchical and nodes 191-195, 251-254 of the product structure tree are arranged in a parent-child relationship. For instance, the node 251 is the highest node in the hierarchy (also called root node) and defines parent-child relationships with its descendants 252-253. The node 253 also defines a parent-child relationship with its descendant node 254, which in turn defines parent-child relationships with its descendant nodes, for instance the leaves 191-195. The parent node 254 of the leaves 191-195 may represent a sub-assembly (or sub-tree) that contains the leaves 191-195.

The GUI 100 may further show various types of graphic tools 130, 170, 180 for example for facilitating 3D orientation of the object, for triggering a simulation of an operation of an edited product or render various attributes of the displayed product 200. A cursor 160 may be controlled by a haptic device to allow the user to interact with the graphic tools.

Figure 3:
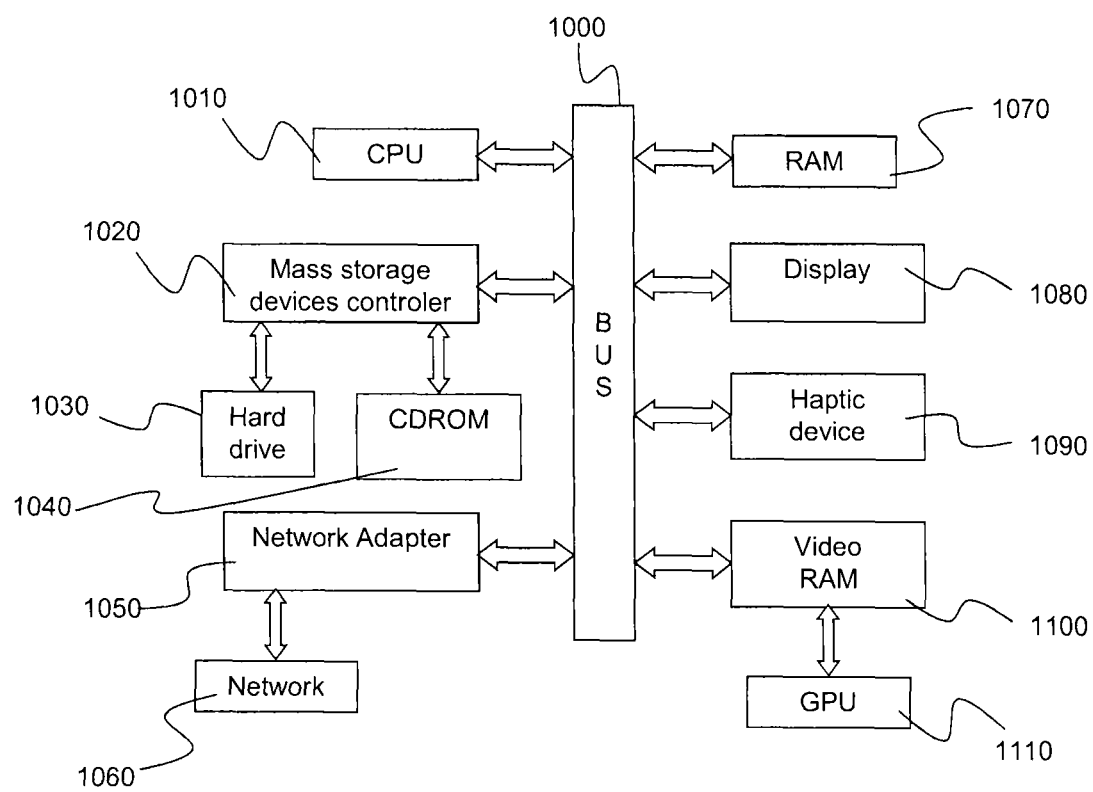
FIG. 3 shows an example of the system.

FIG. 3 shows an example of a system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Referring back to FIG. 1, at step S10, a 3D modeled assembly of parts is displayed, e.g. on a display 1080 of FIG. 3. The parts of the 3D modeled assembly are typically 3D modeled objects; the parts are thus 3D parts. The 3D modeled assembly has a hierarchical structure, which means that the parts forming the assembly are hierarchically interrelated, as known in the art. The hierarchical structure of the 3D modeled assembly may be materialized in a feature tree, e.g. the feature tree 250 on FIG. 2. As discussed in reference of FIG. 2, the hierarchical structure of the 3D modeled assembly is represented by a product structure tree wherein every part in the structure, except one (the root node), is subordinate to a single other part.

Figure 4:
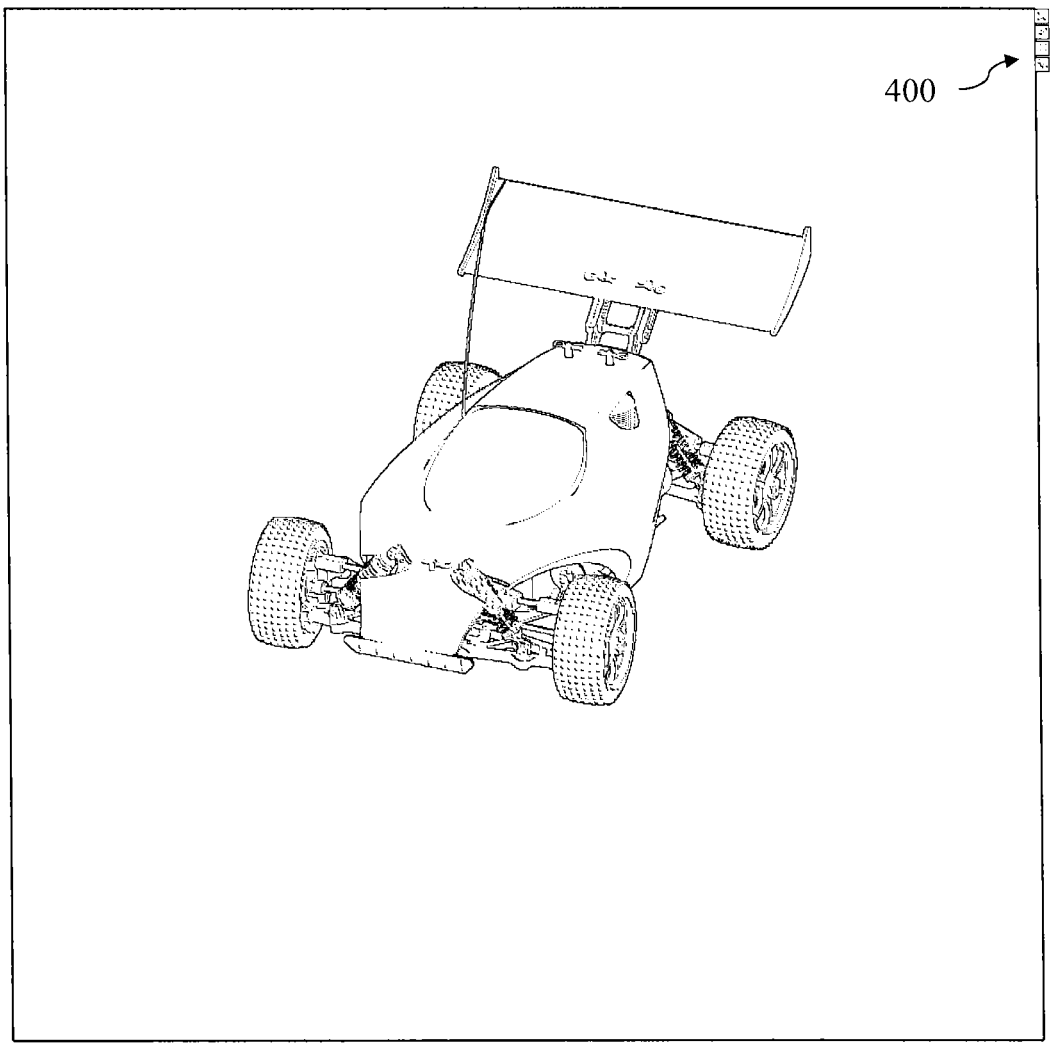
FIG. 4 shows an example of an assembly of parts.

FIG. 4 shows an example of 3D assembly of 3D parts that represents a dune buggy. The 3D assembly is displayed on a GUI, e.g. the GUI represented on FIG. 2. Interestingly, the dune buggy is surrounded by a bounding frame that defines the area of the display in which the dune buggy can completely be displayed. Here, the bounding frame is represented by a square in plain line. In practice, the bounding frame is selected so that is covers the largest part of the computer display, thus allowing to display the complete assembly with the largest size possible. The dune buggy can be freely rotated upon user action. Alternatively, the rotation of the assembly of parts might be performed automatically, that is, without any user action. The rotation of a 3D part (or of a sub-assembly of parts or of an assembly of parts) can be performed about a center of rotation of the part (or of the sub-assembly of parts or of the assembly of parts), as known in the art. Any point of a part can be used as a center of rotation, e.g. the barycenter of the part. In practice, the point serving as center of rotation is located on the center of the cell wherein the part is displayed. This advantageously allows rotating the object while keeping the complete object displayed in the cell.

Next, at step S20 of FIG. 1, the 3D modeled assembly is exploded into parts. This is performed upon user action, that is, the 3D assembly is exploded as a result of a user action. Each part of the assembly corresponds to a first hierarchical level.

The expression hierarchical level is now discussed. As previously explained, the hierarchical structure of an assembly is a hierarchical decomposition of the assembly wherein relationships of the parts forming the assembly are arbitrarily settled by the user. The hierarchical structure is a tree, thus forming a so called "assembly structure tree" which is comprised of leaves and nodes. A node identifies a sub-assembly of modeled objects (or parts), and a leaf identifies a modeled object (or a part). A node is symbolic (or virtual) link to parts of the assembly, while a leaf of the product structure tree is particular node in that a leaf is a hard link to a modeled object. The root of the feature tree corresponds to the 3D modeled assembly of parts: all the parts forming the assembly are reachable starting from the root of the feature tree. For the sake of simplicity only, the term part will encompass in the following description both sub-assemblies of parts and parts.

The first one or more nodes (which can include one or more leaves, a leaf being a node of product structure tree) encountered when traversing the "product structure tree" from the root to the leaves belong to the first hierarchical level. Hence, the first hierarchical level comprises the node(s) (and leaf(-ves)) that are directly connected to the root node.

The second one or more nodes (and/or one or more leaves) encountered when traversing the "product structure tree" from the root to the leaves belong to the second hierarchical level, wherein the path that connects the root node to each node or each leaf of the second hierarchical level is a simple path that comprises three nodes: the root node, the node(s) of the first hierarchical level, and the node of the second hierarchical level. By definition, a simple path is a path in the hierarchy of the product structure with no repeated vertices.

More generally, the $n^{th}$ node(s) and $n^{th}$ leaf(-ves) encountered when traversing the "product structure tree" from the root to the leaves belong to the $n^{th}$ hierarchical level, wherein the path that connects the root node to each node or leaf of the $n^{th}$ hierarchical level is a simple path that comprises n+1 vertices, namely, the root node, the n−1 node(s) of the n−1 hierarchical levels, and the node of the $n^{th}$ hierarchical level.

Exploding the assembly means that the parts corresponding to a given hierarchical level of the hierarchical structure of the assembly are no more assembled, that is, the parts of the given hierarchical level are displayed separately. The parts forming the exploded view are determined according to the hierarchical level they belong, but also according to the node or leaf they belong. Hence, for each leaf identified at a given level of the hierarchy, the single part linked to the said leaf is displayed separately of the other part(s) or sub-assembly(ies) of parts of the assembly, and for each node identified at a given level of the hierarchy, a sub-assembly of parts is displayed separately of the other part(s) or sub-assembly(ies) of parts of the assembly.

Referring now to FIG. 4, the step S20 may be triggered upon user action, e.g. by clicking on a dedicated button 400.

Back to FIG. 1, at step S30, the number of parts resulting from the explosion is determined. This amounts to say that one counts the number of nodes and leaves found at a given hierarchical level, here the first hierarchical level. Counting the number of nodes and leaves is performed as known in the art.

Then, at step S40, the number of cells of a 2D table is determined, the determination being performed according to the number of parts determined at step S30.

The expression 2D table means a 2D structure made up of a series of intersecting straight vertical and horizontal guide lines. The set of intersecting straight vertical and horizontal guide lines form a quadrilateral tiling comprising a set of cells that are the topology forming the tiling. A table is thus a set of rows and columns that may contain data, e.g. representation of 3D parts. The term cell means a bounded space part of the table. The cells may have several shapes such as, but not limited to, squares or rectangles. In practice, the table is a square grid wherein the cells are square. In a general purpose CAD system, square can statically best hold all designed parts as there is no reason to privilege horizon or vertical dimension.

The number of cells of the 2D table is greater than or at least equal to the number of parts and/or sub-assemblies of parts obtained as a result of the explosion of the assembly of parts. The number of cells may be chosen so that it is minimal, being understood that this number is at least equal to the number of parts determined at step S30. For instance, the length of the 2D table can be the ceiling of the square root of N, N being the number of parts to be distributed in the table.

Next, at step S50, the parts of the exploded assembly are displayed, that is, each part linked to a leaf of the first hierarchical level and/or each sub-assembly linked to a node of the first hierarchical level are displayed separately. Displaying separately means that each part and/or sub-assembly is represented in a restricted area wherein no other part can be represented: here, each part (and/or sub-assembly) of the exploded assembly is displayed in one cell of the 2D table.

Figure 5:
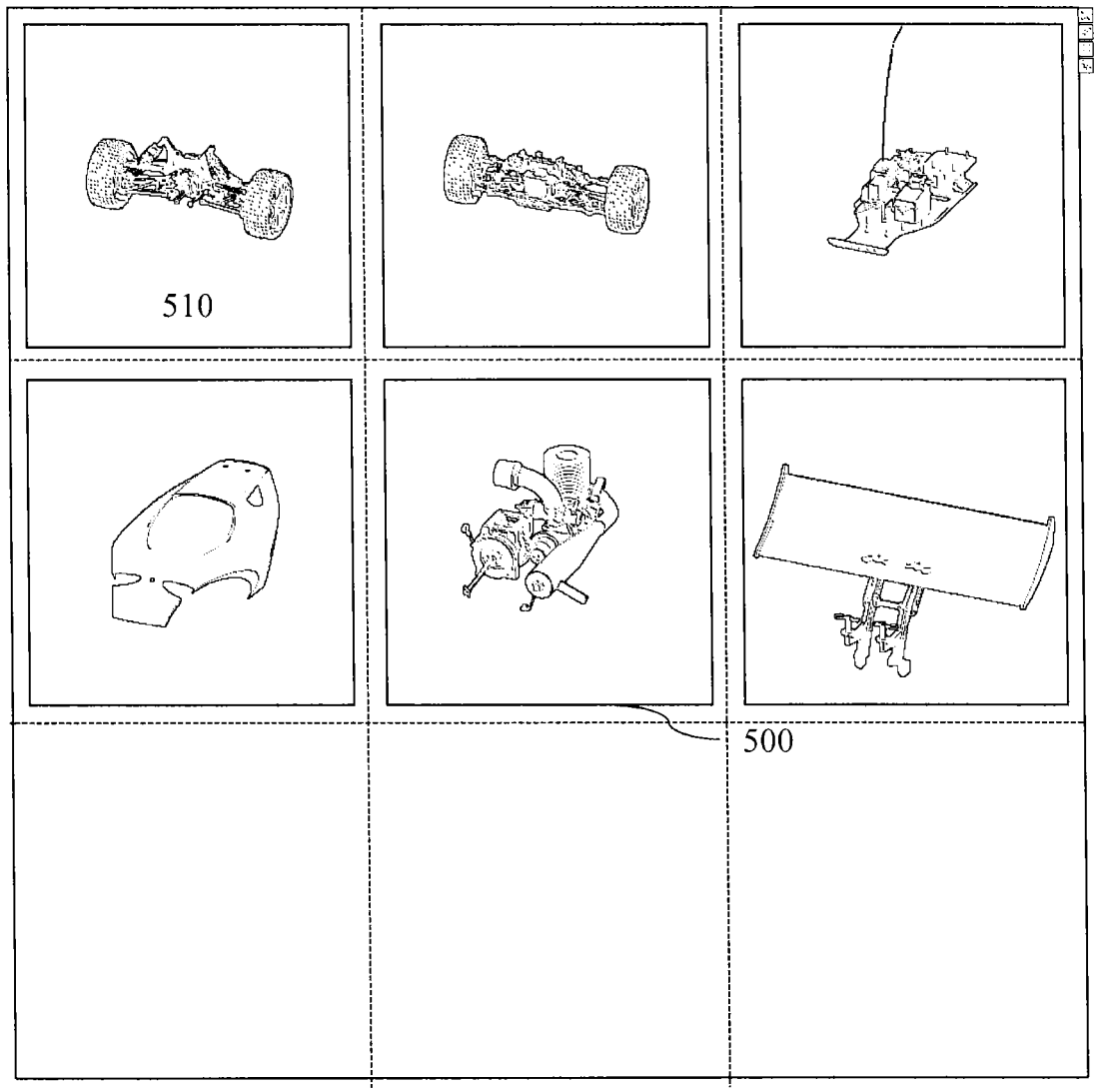
FIG. 5 shows an example of navigation in the assembly of FIG. 4.

Referring now to FIG. 5, it is shown an example of the display of the parts of the exploded assembly represented on FIG. 4. Six parts have been determined at step S20-S30. In this example, the six parts of the first hierarchical level are sub-assemblies of parts. The bounding frame of FIG. 4 is a square that has been divided into nine cells. The borders of the cells are represented by dotted line, excepted for the lines forming the square bounding frame that are represented with plain lines. In this example, nine cells have been determined because the bounding frame is a square and the cells are also squares. It is to be understood that the number of cells might be for instance equal to the number of parts of the first hierarchical level: in this case, the six cells might be six rectangles taking place within the bounding frame of FIG. 4.

In practice, each part may be displayed within a bounding frame enclosed in the cell. In FIG. 5, the bounding frames are represented by plains lines, for instance the bounding frame 500. The bounding frame allows to slightly decrease the area of the cell on which the part is displayed, which in turn creates a space between neighbor cells so that the user can more easily focus on one part of a given without being disturbed by the other part displayed in neighbor cells.

At step S60, one of the parts displayed in a cell is selected. The selected part is a sub-assembly of parts. The selection is performed upon user action, e.g. the user clicks on the sub-assembly shown in the cell.

The selection of one of the parts may further comprise modifying rendering properties of the displayed objects. For instance, the unselected parts may be displayed using a ghost shading. This makes easier for the designer the tracking of the selected part displayed in normal shading while other parts are displayed in a ghost shading. Ghost shading is a rendering in which 3D representation are rendered without color and in highly transparent style.

Next, at steps S70 and S80, the selected part is exploded and the number of subparts is determined. Steps S70 and S80 are similarly performed as steps S20 and S30.

Then, at step S90, the number of cells of a 2D table is determined. The determination is performed according to the number of parts determined at step S80. Step S90 is performed the same way as S40.

Next, at step S100, each part of the exploded part selected at step S60 is displayed in one cell of the 2D table. The 2D table is enclosed within the cell wherein the selected part (S60) was displayed. Hence, the selected part is replaced by the sub-parts forming said selected part. Said otherwise, each sub-part corresponding to the second hierarchical level is displayed in one cell of a second 2D table located in the cell wherein the selected part was displayed initially.

The steps S60 to S100 may be concomitantly carried out upon a single user action. For instance, the user clicks on a button that sticks on the bounding frame wherein the part to be selected is displayed. It is to be understood that the steps S20 to S50 may be also concomitantly carried out upon a single user action.

Figure 6:
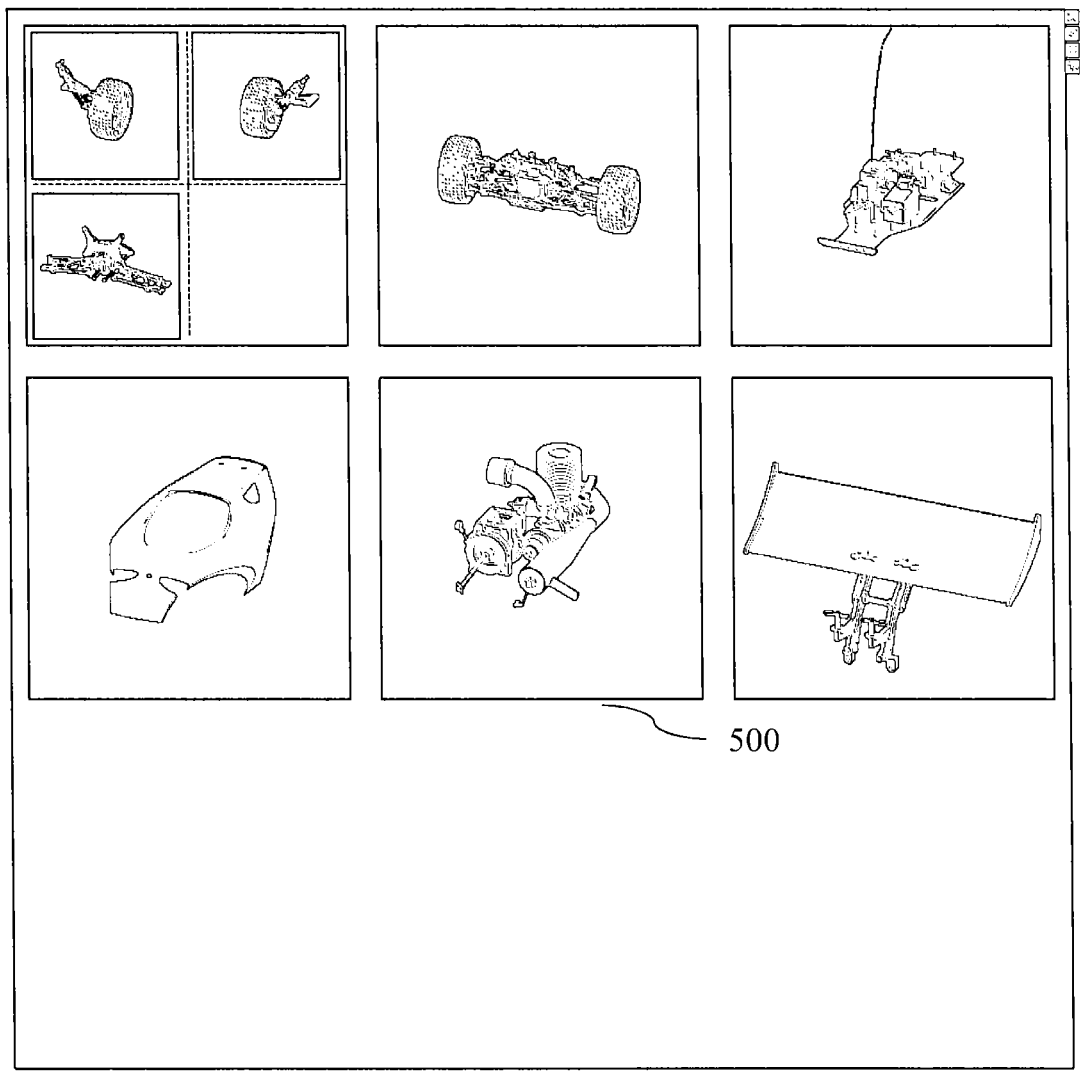
FIGS. 6 and 7 show an example of navigation in the assembly of FIG. 5.

Referring now to FIG. 6, it is shown an example of the display of the parts of the selected part 510 represented on FIG. 5. The part 510 (which is a sub-assembly of parts) belongs to the first hierarchical level of the dune buggy represented on FIG. 4, and three sub-parts corresponding to a second hierarchical level of the dune buggy have been identified. The bounding frame of the selected part 510 of FIG. 5 is a square that has been divided into four cells, which may be referred to as sub-cells. The borders of the sub-cells are represented by dotted line, excepted for the lines forming the bounding frame of the selected part 510 that are represented with plain lines. In the event the cell in which the selected part 510 is represented does not comprise a bounding frame, the four cells of the second table would be enclosed in this cell.

Interestingly, each part may be scaled to fit its cell, as shown in FIG. 6. This involves that the user can see the complete representations of the parts that are displayed in each cell, thus improving the global knowledge the user can have of the assembly. By providing a homogeneous view of all the subparts independent with respect to their physical size, can facilitate the user to fast search subpart by their 3D shape. Such a view is typically provided to the user by default.

Figure 7:
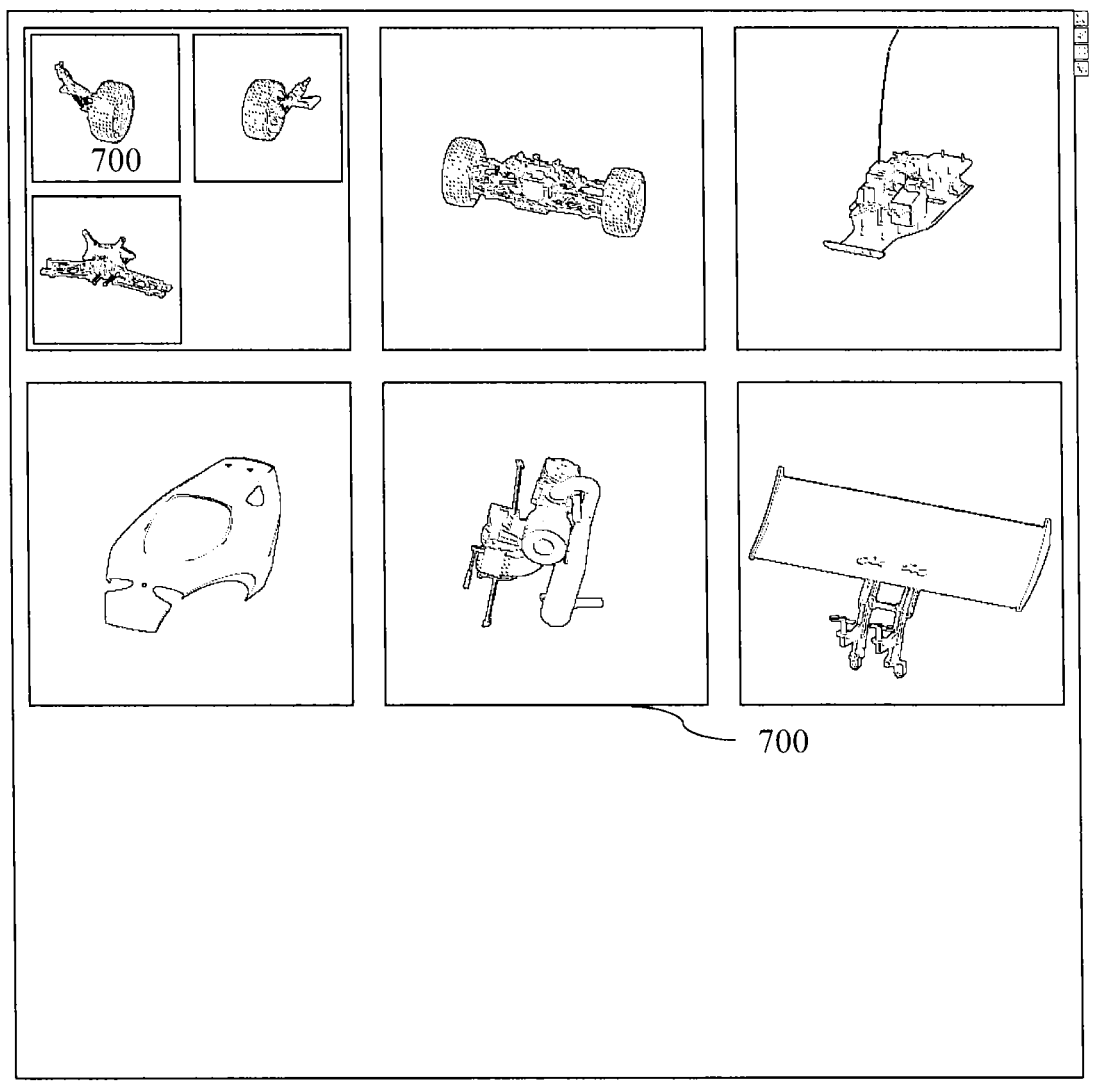

Each part displayed in one cell may be freely rotated in its cell. A part may be individually rotated about a center of rotation of the part while the representations of the other displayed parts remain stationary. Thus, the 3D part can be viewed from all angles, that is, the viewpoint of the part can be changed. For instance, the 3D part displayed in the cell 500 on FIG. 6 has been slightly rotated upon user action on FIG. 7. The same part is displayed, but with a new orientation while the orientation of the other representations kept unchanged.

Preferably, sub-assemblies and parts of the exploded assembly (S20) or sub-assemblies and parts of the exploded sub-assembly (S70) are displayed with the same orientation as the one they had before the exploding step. This advantageously allows the user to better comprehend the relation between the former unexploded assembly and the parts forming the exploded assembly and to better track a particular subpart before and after the exploding step.

Back to FIG. 1, the user can perform a new selection of one of the parts displayed so that the steps S60 to S100 are repeated. For instance, the user can select the sub-assembly 700 of FIG. 7, and as a result of the selection, the sub-assembly is exploded into twenty parts that are displayed in cells of a 2D table located within the cell 700 wherein the former sub-assembly was displayed, as shown on FIG. 8. In this example, the parts displayed on FIG. 8 belong to a third hierarchical level met when traversing the "product structure tree".

It is to be understood that when the part displayed in a cell is a part corresponding to a leaf of the hierarchical structure of the assembly of parts, the steps S60 to S100 cannot be repeated. Said otherwise, the steps S60 to S100 can be repeated while at least one sub-assembly of parts is displayed in a cell.

Figure 8:
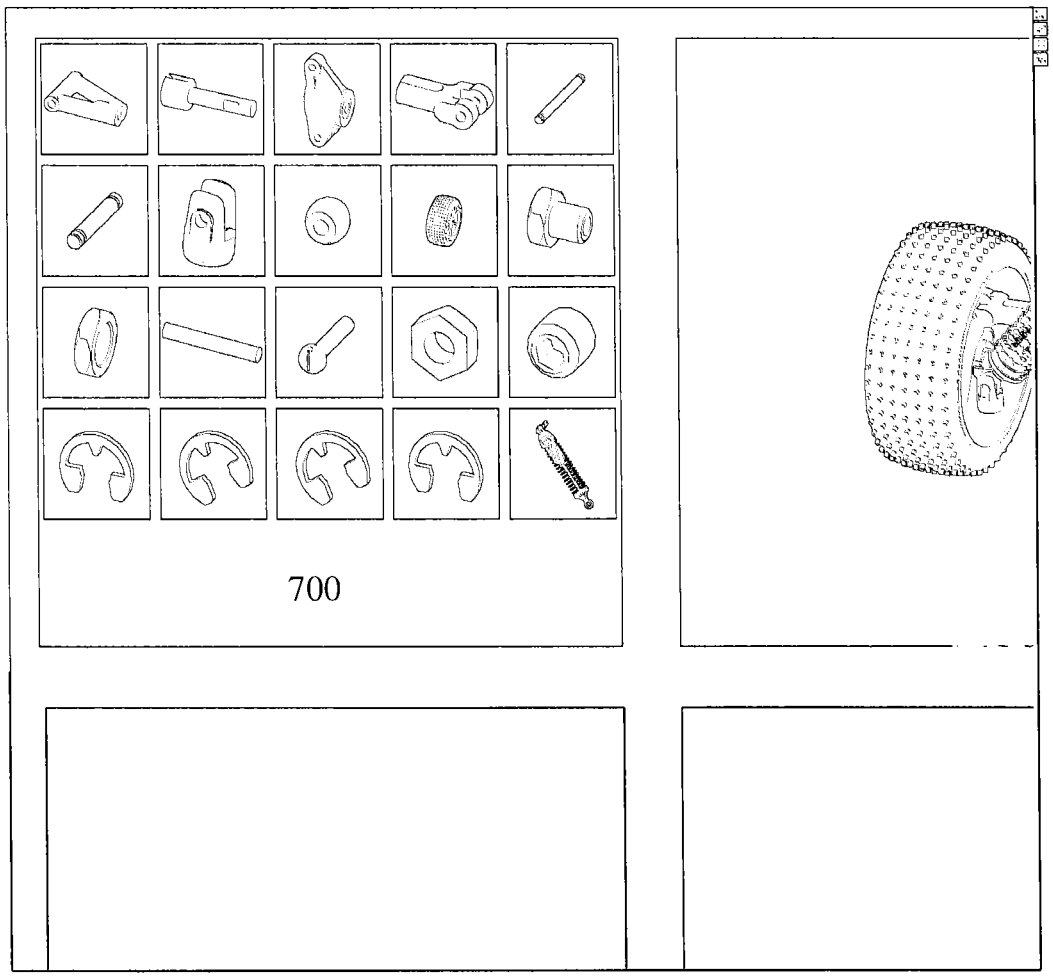
FIG. 8 shows an example of navigation in the assembly of FIG. 6 or 7.

The user may trigger an individual zoom in of one cell, e.g. the cell 800 shown on FIG. 8. This allows the user to focus on the parts displayed therein. Inversely, the user may trigger an individual zoom out of one cell, e.g. in order to re-establish the initial view.

The navigation through the hierarchical structure of a 3D modeled assembly of 3D parts can be performed up and down, which means that the user can navigate from the root of the hierarchical structure to the leaves, and inversely from the leaves to the root. Hence, after the displaying of the exploded assembly of parts, the user can trigger an undo of the step of exploding so that the assembly of parts (formerly exploded) is reconstructed. Said otherwise, the undo of the step of exploding consists in reassembling or putting together the parts belonging to a node of the hierarchical structure. It is to be understood that the 2D table comprising the cells in which the parts (of the formerly exploded assembly) were displayed is removed and that the reassembled assembly is displayed in the cell wherein the removed 2D table was enclosed.

The invention claimed is:

1. A computer-implemented method for navigating through a hierarchical structure of a three-dimensional modeled assembly, the computer-implemented method comprising:
   displaying the three-dimensional modeled assembly on a display, the three-dimensional modeled assembly being completely displayed within a bounding frame, the bounding frame being entirely visible on the display;
   exploding, via a computer and upon user interaction, the three-dimensional modeled assembly into parts, each part of the assembly corresponding to a first hierarchical level; and
   displaying each part corresponding to the first hierarchical level in a respective one cell of a first two-dimensional table that divides all the available screen space within the bounding frame into cells wherein the parts are represented, all the cells in which a part is represented being entirely visible on the display, each part displayed in the respective one cell is freely and independently rotatable in the respective one cell of each part, a number of cells of the first two-dimensional table being greater than or at least equal to a number of parts of the assembly corresponding to the first hierarchical level;
   exploding, via the computer and upon user interaction, a part corresponding to the first hierarchical level into parts corresponding to a second hierarchical level; and
   displaying each part corresponding to the second hierarchical level in a respective one cell of a second two-dimensional table located in the respective one cell in which the exploded part was displayed, a number of cells of the second two-dimensional table being greater than or at least equal to a number of parts of the assembly corresponding to the second hierarchical level.

2. The computer-implemented method of claim 1, wherein each part is scaled to fit the respective one cell of each part.

3. The computer-implemented method of claim 1, further comprising:
   triggering, upon user action, a zoom in or a zoom out of the one cell of the first two-dimensional table; and
   after the displaying, undoing the exploding, and displaying a reassembly of the formerly exploded three-dimensional modeled assembly.

4. The computer-implemented method of claim 1, wherein each part is displayed within a bounding frame enclosed in the respective one cell.

5. The computer-implemented method of claim 1, wherein each part is displayed with a same orientation as the three-dimensional modeled assembly displayed before the exploding step.

6. The computer-implemented method of claim 1, further comprising, after the displaying:
   undoing the exploding; and
   displaying a reassembly of the formerly exploded three-dimensional modeled assembly.

7. The computer-implemented method of claim 1, further comprising:
   receiving a selection of one of the displayed parts; and
   displaying the selected part in a ghost shading.

8. The computer-implemented method of claim 1, wherein the first two-dimensional table is a two-dimensional square table.

9. A non-transitory computer readable data storage medium having recorded thereon instructions that when executed by a computer cause the computer to implement a method for navigating through a hierarchical structure of a three-dimensional modeled assembly, the method comprising:
 displaying the three-dimensional modeled assembly on a display, the three-dimensional modeled assembly being completely displayed within a bounding frame, the bounding frame being entirely visible on the display;
 exploding, via the computer and upon user interaction, the three-dimensional modeled assembly into parts, each part of the assembly corresponding to a first hierarchical level; and
 displaying each part corresponding to the first hierarchical level in a respective one cell of a first two-dimensional table that divides all the available screen space within the bounding frame into cells wherein the parts are represented, all the cells in which a part is represented being entirely visible on the display, each part displayed in the respective one cell is freely and independently rotatable in the respective one cell of each part, a number of cells of the first two-dimensional table being greater than or at least equal to a number of parts of the assembly corresponding to the first hierarchical level;
 exploding, via the computer and upon user interaction, a part corresponding to the first hierarchical level into parts corresponding to a second hierarchical level; and
 displaying each part corresponding to the second hierarchical level in a respective one cell of a second two-dimensional table located in the respective one cell in which the exploded part was displayed, a number of cells of the second two-dimensional table being greater than or at least equal to a number of parts of the assembly corresponding to the second hierarchical level.

10. The non-transitory computer readable data storage medium of claim 9, wherein each part is scaled to fit the respective one cell of each part.

11. The non-transitory computer readable data storage medium of claim 9, wherein each part is displayed within a bounding frame enclosed in the respective one cell.

12. The non-transitory computer readable data storage medium of claim 9, wherein each part is displayed with a same orientation as the three-dimensional modeled assembly displayed before the exploding.

13. The non-transitory computer readable data storage medium of claim 9, further comprising, after the displaying:
 undoing the exploding; and
 displaying a reassembly of the formerly exploded three-dimensional modeled assembly.

14. The non-transitory computer readable data storage medium of claim 9, further comprising:
 receiving a selection of one of the displayed parts; and
 displaying the selected part in a ghost shading.

15. The non-transitory computer readable data storage medium of claim 9, wherein the first two-dimensional table is a two-dimensional square table.

16. A computer configured to implement navigation through a hierarchical structure of a three-dimensional modeled assembly, the computer comprising:
 processing circuitry coupled to a memory and a display, the processing circuitry configured to
  display the three-dimensional modeled assembly on the display, the three-dimensional modeled assembly being completely displayed within a bounding frame, the bounding frame being entirely visible on the display,
  explode, upon user interaction, the three-dimensional modeled assembly into parts, each part of the assembly corresponding to a first hierarchical level, and
  display each part corresponding to the first hierarchical level in a respective one cell of a first two-dimensional table that divides all the available screen space within the bounding frame into cells wherein the parts are represented, all the cells in which a part is represented being entirely visible on the display, each part displayed in the respective one cell is freely and independently rotatable in the respective one cell of each part, a number of cells of the first two-dimensional table being greater than or at least equal to a number of parts of the assembly corresponding to the first hierarchical level,
  explode, upon user interaction, a part corresponding to the first hierarchical level into parts corresponding to a second hierarchical level, and
  display each part corresponding to the second hierarchical level in a respective one cell of a second two-dimensional table located in the respective one cell in which the exploded part was displayed, a number of cells of the second two-dimensional table being greater than or at least equal to a number of parts of the assembly corresponding to the second hierarchical level.

* * * * *